United States Patent
Nguyen et al.

[19]

[11] Patent Number: 6,043,164
[45] Date of Patent: *Mar. 28, 2000

[54] METHOD FOR TRANSFERRING A MULTI-LEVEL PHOTORESIST PATTERN

[75] Inventors: Tue Nguyen, Vancouver; Sheng Teng Hsu, Camas; Jer-shen Maa, Vancouver, all of Wash.; Bruce Dale Ulrich, Beaverton, Oreg.; Chien-Hsiung Peng, Vancouver, Wash.

[73] Assignee: Sharp Laboratories of America, Inc., Camas, Wash.

[*] Notice: This patent is subject to a terminal disclaimer.

[21] Appl. No.: 08/665,014

[22] Filed: Jun. 10, 1996

[51] Int. Cl.[7] .................................................. H01L 21/302

[52] U.S. Cl. .......................... 438/736; 438/738; 438/717; 438/782; 430/312; 430/323

[58] Field of Search .................................... 430/312, 323; 438/736, 738, 717, 782

[56] References Cited

U.S. PATENT DOCUMENTS

| | | | |
|---|---|---|---|
| 5,225,035 | 7/1993 | Rolfson | 156/643 |
| 5,237,393 | 8/1993 | Tominaga | 356/401 |
| 5,308,721 | 5/1994 | Garofalo et al. | 430/5 |
| 5,328,807 | 7/1994 | Tanaka et al. | 430/311 |
| 5,358,827 | 10/1994 | Garofalo et al. | 430/313 |
| 5,384,218 | 1/1995 | Tokui et al. | 430/5 |
| 5,384,219 | 1/1995 | Dao et al. | 430/5 |
| 5,414,746 | 5/1995 | Deguchi et al. | 378/35 |
| 5,426,010 | 6/1995 | Morton | 430/22 |
| 5,446,521 | 8/1995 | Hainsey et al. | 355/53 |
| 5,460,908 | 10/1995 | Reinberg | 430/5 |
| 5,477,058 | 12/1995 | Sato | 250/548 |
| 5,635,337 | 6/1997 | Bartha et al. | 430/323 |
| 5,635,423 | 6/1997 | Huang et al. | 438/700 |
| 5,738,757 | 4/1998 | Burns et al. | 156/644.1 |
| 5,741,624 | 4/1998 | Jeng et al. | 430/312 |
| 5,753,417 | 5/1998 | Ulrich | 430/312 |
| 5,821,169 | 10/1998 | Nguyen et al. | 438/736 |

OTHER PUBLICATIONS

Article entitled, "Fabrication of 64M Dram with i-Line Phase-Shift Lithography" by K. Nakagaw, M. Taguchi and T. Ema printed in the IEDM 90–817, 1990 IEEE, pp 33.1.1–33.1.4.

Article entitled, "Transparent Phase Shifting Mask", by H. Watanabe, Y. Todokoro, and M. Inoue, printed in the IEMM 90–821, 1990 IEEE, pp 33.2.1–33.2.4.

Article entitled, "The Control of Sidelobe Intensity with Arrangement of the Chrome Pattern (COSAC) in Half-Tone Phase-Shifting Mask", by S. Kobayashi, N. Oka, K. Watanabe, M. Inoue and K. Sakiyama, reprinted from Extended Abstracts of 1995 Int'l Conference on Solid State Devices and Materials, Aug. 1995, pp 935–937.

Article entitled, "Improving Resolution in Photolithography with a Phase-Shifting Mask", by M. Levenson, N.S. Viswanathan and R. Simpson, printed in the IEEE Transactions on Electron Devices, vol. ED–29, No. 12, Dec. 1982.

Article entitled, "Phase Masks and Grey-Tone Masks", by Pierre Sixt, Litomask by SCEM, Neuchatel, Switzerland, printed in Semiconductor Fabtech, Issue No. 2, 1995, pp 209–213.

Primary Examiner—Jey Tsai
Assistant Examiner—Lynne A. Gurley
Attorney, Agent, or Firm—David C. Ripma; Mathew D. Rabdau

[57] ABSTRACT

A method is provided for forming an intermediate level in an integrated circuit dielectric during a damascene process using a photoresist mask having an intermediate thickness. The method forms an interconnect to a first depth in the dielectric through an opening in the photoresist pattern. The photoresist profile is partially etched away in the area of the intermediate thickness to reveal a second dielectric surface area. The second dielectric surface area is then etched to a second depth less than the first depth. In this manner, vias can be formed to the first depth, and lines can be formed at a second depth to intersect the vias. The method of the present invention allows a dual damascene process to be performed with a single step of photoresist formation.

27 Claims, 11 Drawing Sheets

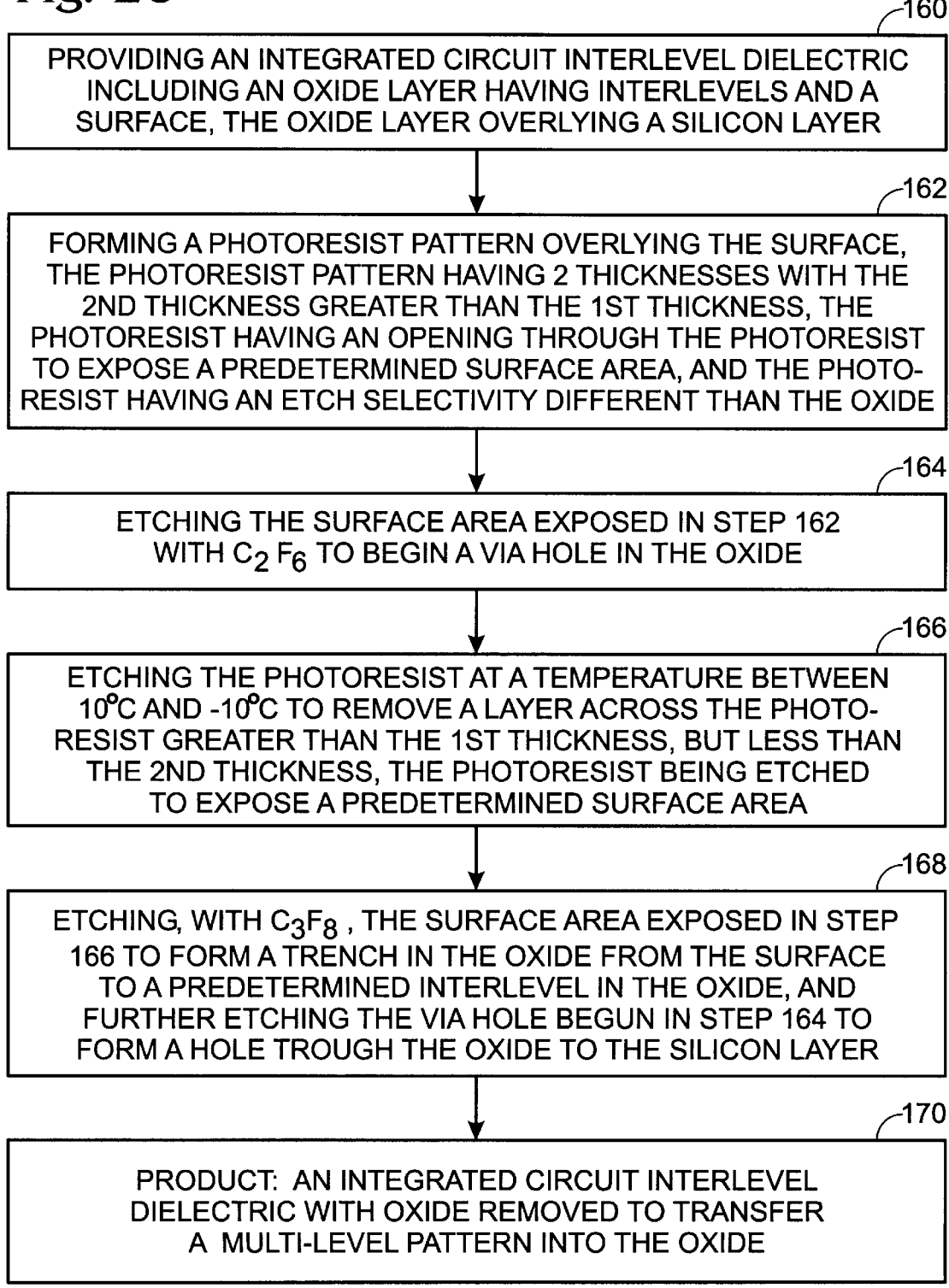

METHOD FOR TRANSFERRING A MULTI-LEVEL PHOTORESIST PATTERN

BACKGROUND AND SUMMARY OF THE INVENTION

This invention relates generally to integrated circuit processes and fabrication, and more particularly to a method for transferring a multi-level photoresist pattern to an interlevel dielectric.

The demand for progressively smaller and more powerful electronic products, in turn, fuels the need for smaller geometry integrated circuits (ICs), and large substrates. It also creates a demand for a denser packaging of circuits onto IC substrates. The desire for smaller geometry IC circuits requires that the interconnections between components and dielectric layers be as small as possible. Therefore, research continues into reducing the width of via interconnects and connecting lines. Copper is a natural choice to replace aluminum in the effort to reduce the size of lines and vias in an electrical circuit. The conductivity of copper is approximately twice that of aluminum and over three times that of tungsten. As a result, the same current can be carried through a copper line having half the cross-section of an aluminum line.

The electromigration characteristics of copper are also much superior to those of aluminum. Copper is approximately ten times better than aluminum with respect to electromigration. As a result, a copper line, even one having a much smaller width than aluminum line, is able to maintain electrical and mechanical integrity.

There have been problems associated with the use of copper, however, in IC processing. Copper pollutes many of the materials used in IC processes and, therefore, care must be taken to keep copper from migrating. In addition, copper is especially prone to oxidation, especially during oxygen etch processes. Care must be taken to protect copper from exposure during etch processes, annealing, and processes requiring high temperature. Also, the oxidation products of copper are difficult to clean. In addition, copper cannot be deposited onto substrates using the conventional processes for the deposition of aluminum. That is, new deposition processes have been developed for use with copper, instead of aluminum, in the lines and interconnects of an IC interlevel dielectric.

It is impractical to sputter metal, either copper or aluminum to fill small diameter vias, it has poor gap filling capability. To deposit copper, a chemical vapor deposition (CVD) technique has been developed in the industry. However, even with the CVD technique, the convention etch process method cannot be used. The low volatility of copper etch products require copper to be removed (vaporized) at high temperatures, approximately 250° C., which is too high for photoresist masks. Due to oxidation cooper cannot be removed with a plasma etch. Wet etches are isotropic, and so too imprecise for many applications. Therefore, the IC processing industry has developed a process to form a via using CVD without etching the copper. The new method is called the inlay, or damascene, process.

The damascene method for forming a via between a substrate surface and an overlying dielectric surface is described below. The underlying substrate surface is first completely covered with a dielectric, such as oxide. A patterned photoresist profile is then formed over the oxide. The resist profile has an opening, or hole, in the photoresist corresponding to the area in the oxide where the via is to be formed. Other areas of the oxide to be left in place are covered with photoresist. The photoresist covered dielectric is then etched to remove oxide underlying the hole in the photoresist. The photoresist is then stripped away. CVD copper is then used to fill the via. A layer consisting of oxide with a copper via through it now overlies the substrate surface. The excess copper remaining is removed with a chemical mechanical polish (CMP) process, as is well known in the art.

Since the damascene processing method is relatively new to the IC industry, refinements in the technique are ongoing. One refinement is the dual damascene method. In the dual damascene method vias, interconnects, and lines are formed in a dielectric at two different levels. In terms of the example of the damascene process in the preceding paragraph, the dual damascene process adds a second via, or interconnecting line, in the deposited oxide that extends from the new (oxide) surface to a level in the oxide between the underlying substrate surface and the new (oxide) surface. The dual damascene method is described in greater detail as prior art in the detailed description of the preferred embodiments and in FIGS. 1 through 6.

One known method of performing the dual damascene process is through multiple photoresist mask and etch steps. A single level photoresist profile is formed on a layer deposited dielectric and a via pattern is formed by etching to a first interlevel in the dielectric material. At this point in the process the via is only partially etched. The photoresist is then stripped and a second single layer photoresist profile is formed on the dielectric surface to form an interconnect pattern to a second interlevel in the dielectric material. Coincident with etching the interconnect, the via is etched such that interconnects in underlying substrate layers are exposed to allow electrical contact. Aligning the photoresist profiles is a problem using this method. If the two photoresist profiles are not aligned correctly, then intersecting features in the dielectric material will be misaligned. That is, a conductive line associated with the first photoresist pattern may not correctly intersect a via associated with the second photoresist profile. Alignment errors can be corrected by making the intersecting features oversized, but this takes away from the overall goal of reducing the size of connecting lines and vias. Alignment problems reduce yields, and increase cost and the complexity of IC processes.

Another known method of performing the dual damascene process uses photoresist profiles having multiple levels, or thicknesses, to form vias and interconnect at multiple levels in an IC dielectric. An electron beam or laser may be used to directly write a multi-level pattern into photoresist, but is not commercially practical. So called "gray-tone" masks, formed from repetitive patterns of dots that appear as transparent holes on the chromium mask of the reticle, have also been used to form multi-level resist profiles as described by Pierre Sixt, "Phase Masks and Gray-Tone Masks", Semiconductor FabTech, 1995, page 209. Sixt also gives a general description for a process to transfer the multi-level resist onto a dielectric. The process relies on a one-to-one etch selectivity between the dielectric material and the resist material. The dielectric and the overlying photoresist profile are then etched together so that any exposed dielectric material is etched at the same rate as overlying photoresist material. Thinner layers of resist cause a deeper etch into the dielectric so that, after etching, the dielectric shape generally resembles the photoresist pattern overlying the dielectric at the beginning of the process. One problem with this method is finding dielectric materials and photoresist materials that have identical etch selectivity. It is also difficult to transfer various features, especially small or relatively complicated features, into a dielectric using this method. Polymers and by-products of the etch process tend to collect on areas of the resist pattern, changing the shape and etch rates of the resist profile. Further, the article discloses that vias made by this method have a relatively large size, approximately 25 μm, due to the resolution limits imposed with the pixel size in the gray-tone mask. Vias of this size are approximately two orders of magnitude larger than vias formed through conventional methods, and are unsuited for most IC processes.

A multi-level photoresist pattern suitable for use in the method of the present invention is disclosed in co-pending application Ser. No. 08/665,063, filed Jun. 10, 1996, entitled "Multiple Exposure Masking System For Forming Multi-Level Resist Profiles", invented by Bruce Dale Ulrich, Docket No. SMMT 234. A reticle to form a multi-level photoresist pattern suitable for use with the present invention is disclosed in co-pending application Ser. No. 08/660,820, filed Jun. 10, 1996, entitled "Multi-Level Reticle System and Method for Forming Resist Profiles", invented by David Russell Evans, Tue Nguyen, and Bruce Dale Ulrich, Docket No. SMT 166. Both, above mentioned applications are assigned to the same assignees as the instant application.

It would be advantageous to employ a method of forming vias and interconnects to at least two different interlevels beneath the surface of an IC dielectric to perform a damascene process without concern for aligning a series of photoresist masks.

It would be advantageous to use one resist profile, having a plurality of levels, to reduce the number of steps and general complexity of the dual damascene method.

It would be advantageous to use a multi-level resist profile to achieve the via widths and feature resolutions of conventional single level resist profile etching processes.

Accordingly, in an integrated circuit wafer including levels of integrated circuit material having a surface, a method has been provided of forming electrical interconnects from the surface to a plurality of interlevels in the integrated circuit material. The method comprises the step of forming a resist profile over the surface, the resist profile having a plurality of predetermined thicknesses, and the resist profile having an opening through the resist profile to reveal a predetermined surface area. The method comprising the step of removing integrated circuit material underlying the open in the resist profile, and the step of removing a predetermined portion of the resist profile to form an opening revealing a predetermined surface area. Finally, the method provides a step of removing integrated circuit material underlying the opening, whereby integrated circuit material is removed to generally reproduce the shape of the overlying resist profile.

A method has also been provided for transferring a photoresist pattern onto an integrated circuit interlevel dielectric, including an oxide layer having interlevels and a surface, the oxide layer overlying a silicon layer. The method comprising the step of forming a photoresist pattern overlying the surface, the photoresist pattern having two thicknesses with the second thickness greater than the first thickness, the photoresist having an opening through the photoresist to expose a predetermined surface area, and the photoresist having an etch selectivity different than the oxide. A method also comprising the step of etching the surface area with $C_2F_6$ to begin a via hole in the oxide. The method comprising the step of etching the photoresist at a temperature between 10° C. and −10° C. to remove a layer across the photoresist greater than the first thickness, but less than the second thickness, the photoresist being etched to expose a predetermined surface area. The method also comprising the step of etching, with $C_3F_8$, the surface area to form a trench in the oxide from the surface to a predetermined interlevel in the oxide, and further etching the via hole begun in earlier steps to form a hole through the oxide to the silicon layer, whereby the photoresist is selectively etched to form a multi-level pattern in the oxide.

BRIEF DESCRIPTION OF THE DRAWINGS

FIG. 26 is a more detailed flow diagram illustrating the steps of the method of the present invention.

DETAILED DESCRIPTION OF THE PREFERRED EMBODIMENT

Figure 1:
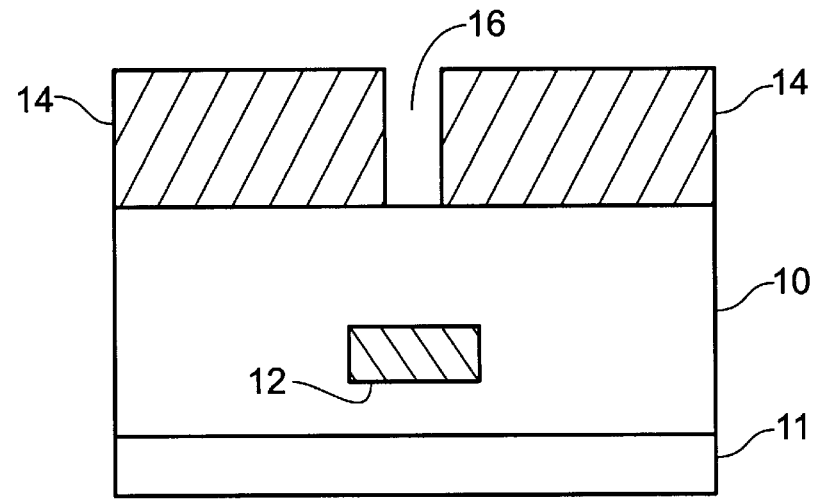
FIG. 1 is a partial cross-sectional view of an IC interlevel dielectric with a first overlying photoresist profile (prior art).
Figure 2:
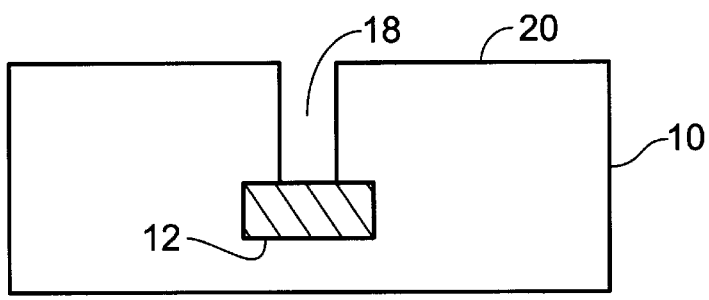
FIG. 2 is a partial cross-sectional view of the IC dielectric of FIG. 1 with a via formed from the surface to a connection area at a first interlevel in the dielectric (prior art).

FIGS. 1 and 2 describe the damascene method of forming a via in an IC interlevel dielectric. FIG. 1 is a partial cross-sectional view of an IC interlevel dielectric with a first overlying photoresist profile (prior art). An IC interlevel dielectric 10 is typically composed of dielectric material such as an oxide. Dielectric 10 overlies a substrate 11, typically of silicon, and has a connecting area 12 composed of a metal or semiconductor material. Alternately, connection area 12 is located at the surface of substrate 11. A photoresist profile 14 overlying dielectric 10 has an opening 16.

FIG. 2 is a partial cross-sectional view of IC dielectric 10 of FIG. 1 with a via 18 formed from the surface to connection area 12 at a first interlevel in dielectric 10 (prior art). After stripping resist 14 a surface 20 of dielectric 10 is exposed.

Figure 3:
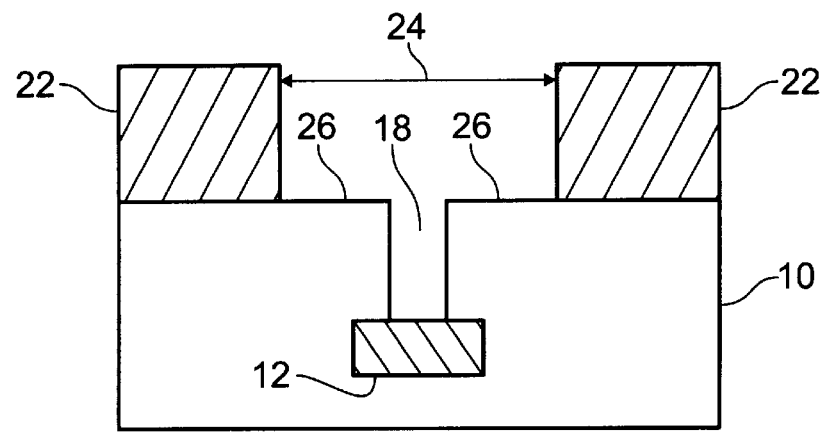
FIG. 3 is a partial cross-sectional view of the IC dielectric of FIG. 2 with a second overlying photoresist profile (prior art).

FIGS. 3 through 6, together with FIGS. 1 and 2, describe the dual damascene process. FIG. 3 is a partial cross-sectional view of IC dielectric 10 of FIG. 2 with a second overlying photoresist profile 22 (prior art). Resist profile 22 has an opening 24 to expose a surface area 26.

Figure 4:
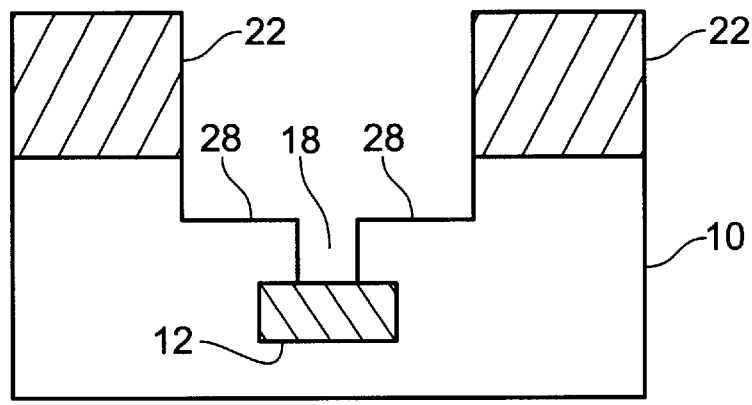
FIG. 4 is a partial cross-sectional view of the IC dielectric of FIG. 3 with an opening formed in the dielectric to a second interlevel (prior art).
Figure 5:
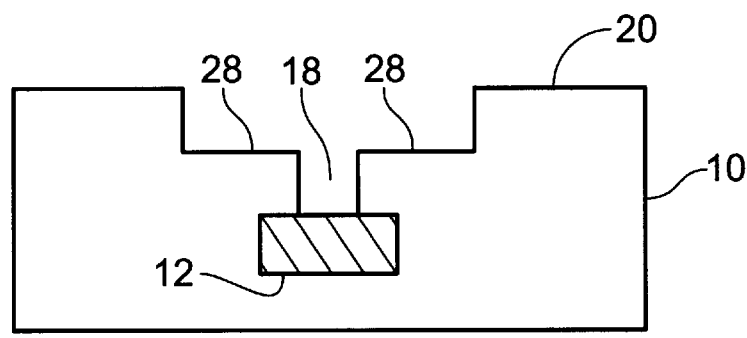
FIG. 5 is a partial cross-sectional view of the IC dielectric of FIG. 4 with the overlying resist profile stripped away (prior art).

FIG. 4 is a partial cross-sectional view of IC dielectric 10 of FIG. 3 with an opening formed in dielectric 10 to a second interlevel 28 (prior art). FIG. 5 is a partial cross-sectional view of IC dielectric 10 of FIG. 4 with overlying resist profile 22 stripped away (prior art).

Figure 6:
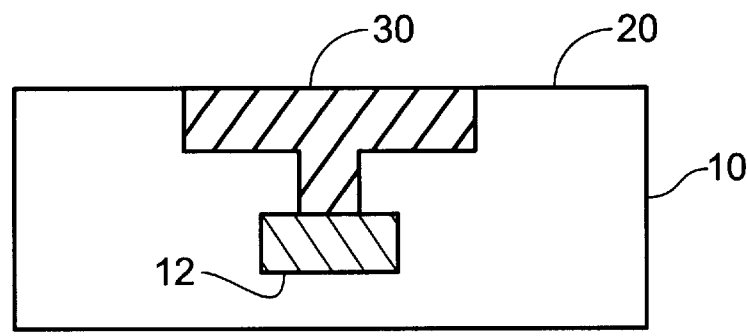
FIG. 6 is a partial cross-sectional view of the IC dielectric of FIG. 5 filled with a conductive material to connect the surface to two interlevels in the IC substrate prior art).

FIG. 6 is a partial cross-sectional view of IC dielectric 10 of FIG. 5 filled with a conductive material 30 to connect surface 20 to two interlevels (28 and 12) in IC dielectric 10 (prior art). Typically, the opening to interlevel 28 is a line intersecting via 18, and so, electrically communicating to connection area 12, and to other vias and connection areas, not shown, on dielectric 10. FIGS. 4–6 display via 18 in the center of the opening to interlevel 28. Via 18 is centered because second resist pattern 22 is aligned correctly with first resist pattern 14. The correct alignment of resist patterns is critical in the dual damascene process and often requires oversized vias and lines in commercial processes to guarantee intersections. In normal commercial process it is almost impossible to intersect interconnects on two interlevels unless at least one of the interconnects is oversized.

FIGS. 7–11 describe to process of transferring a bi-level photoresist pattern into an IC interlevel dielectric. There are several advantages to performing this process with a single resist process step, as opposed to the two resist step process described in FIGS. 1–6. One copper CVD step and one CMP step are saved. As mentioned earlier, the inherent self-alignment from using one mask increases yields and produces more consistent results.

Figure 7:
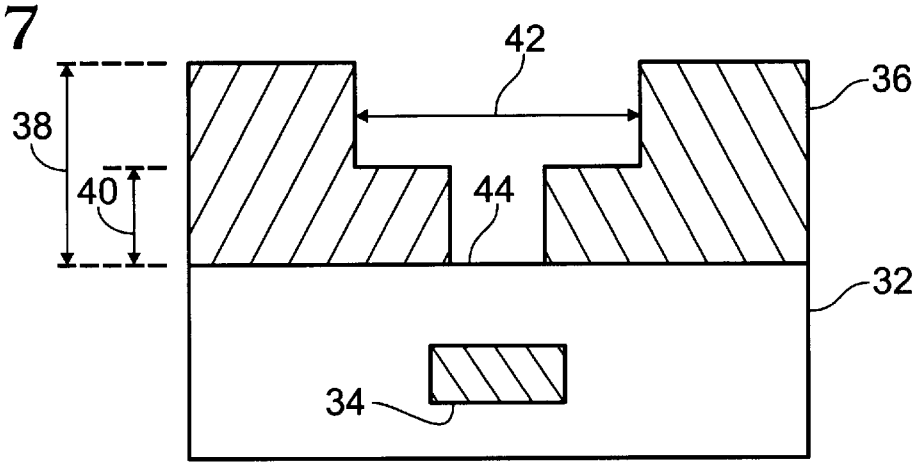
FIG. 7 is a partial cross-sectional view of an IC interlevel dielectric having a connection area at a first interlevel, and an overlying bi-level photoresist profile.

FIG. 7 is a partial cross-sectional view of an IC dielectric 32 having a connection area 34 at a first interlevel, and an overlying bi-level photoresist profile 36. Resist profile 36 has two thicknesses a second thickness 38 greater than a first thickness 40. Resist profile 36 also has an opening 42 through resist profile 36 to expose a surface area 44.

Figure 8:
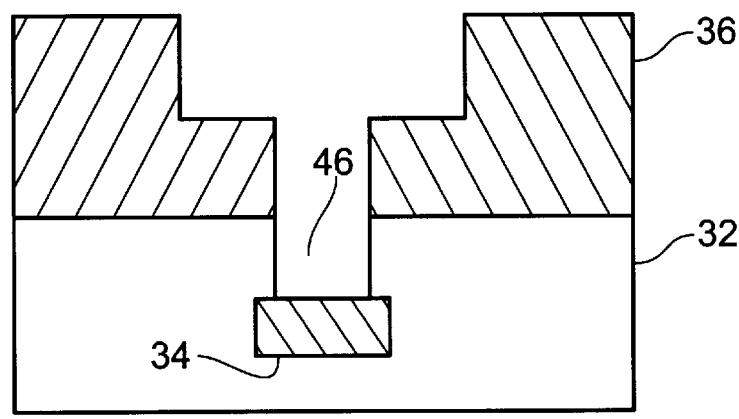
FIG. 8 is a partial cross-sectional view of the IC dielectric of FIG. 7 with a via formed from the surface to the connection area at the first interlevel in the IC dielectric.

FIG. 8 is a partial cross-sectional view of IC dielectric 32 of FIG. 7 with a via 46 formed from surface 44 to connection area 34 at the first interlevel in IC dielectric 32. Alternately, a partial etch is performed from surface 44 to a predetermined intermediate interlevel between surface 44 and connection area 34.

Figure 9:
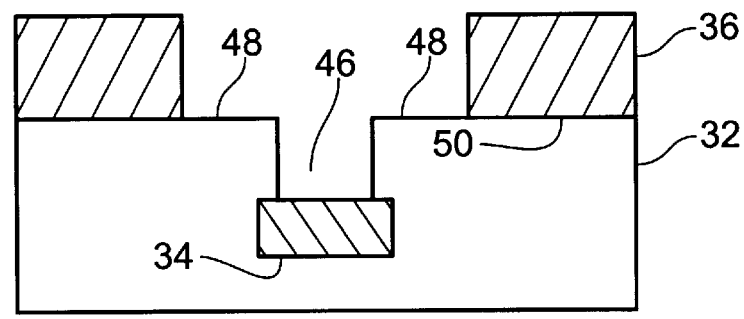
FIG. 9 is a partial cross-sectional view of the IC dielectric of FIG. 8 with a layer of photoresist removed to expose a predetermined surface area.

FIG. 9 is a partial cross-sectional view of IC dielectric 32 of FIG. 8 with a layer of photoresist 36 removed to expose a predetermined surface area 48. In conventional IC processing using a single level resist profile, photoresist 36 is typically ashed, or completely removed, after the etching step described in FIG. 8. In the present invention photoresist profile 36 is partially removed to expose second surface area 48, and partially maintained to protect a surface 50 of dielectric 32. The ability to etch a layer of a predetermined thickness across resist profile 36, without completely removing it, is a novel feature of the present invention.

Figure 10:
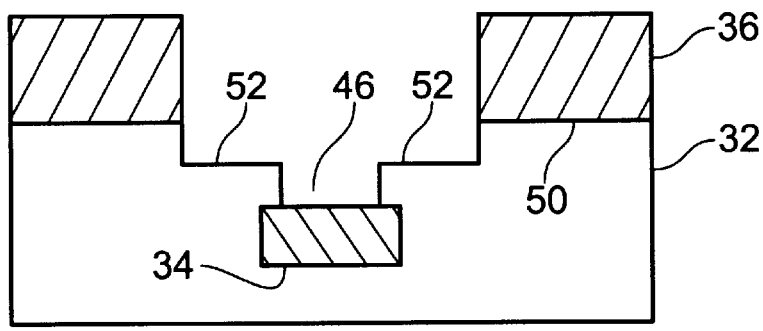
FIG. 10 is a partial cross-sectional view of the IC dielectric of FIG. 9 with an opening formed from the exposed surface area to a second interlevel in the IC dielectric.

FIG. 10 is a partial cross-sectional view of IC dielectric 32 of FIG. 9 with an opening formed from exposed surface area 48 to a second interlevel 52 in IC dielectric 32.

Figure 11:
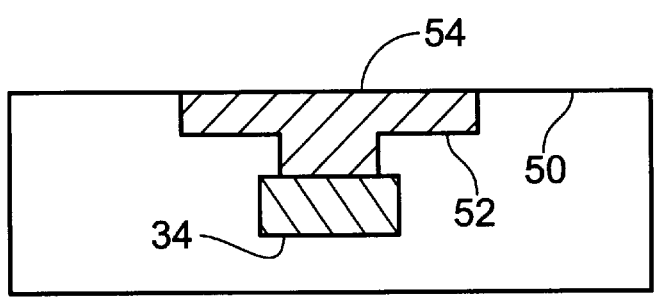
FIG. 11 is a partial cross-sectional view of the IC dielectric of FIG. 10 showing a conductive material in the areas of the dielectric where integrated circuit material has been removed to form interconnects to two interlevels in the IC dielectric.

FIG. 11 is a partial cross-sectional view of IC dielectric 32 of FIG. 10 showing a conductive material 54 in the areas of dielectric 32 where integrated circuit material has been removed to form interconnects to two interlevels (34 and 52) in IC dielectric 32.

Figure 12:
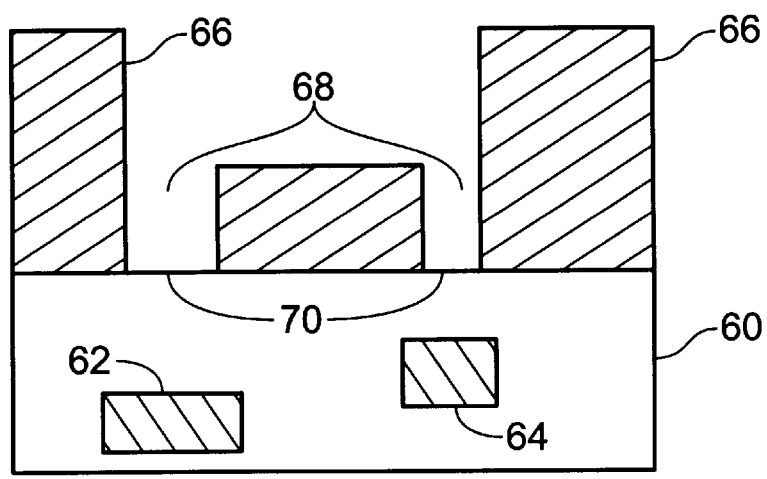
FIG. 12 is a partial cross-sectional view of an IC interlevel dielectric having connection areas at two interlevels with an overlying bi-level resist profile.

FIGS. 12 through 17 describe the present invention process of forming interconnects in an interlevel dielectric to three interlevels. FIG. 12 is a partial cross-sectional view of an IC dielectric 60 having connection areas 62 and 64 at two interlevels with an overlying bi-level resist profile 66. Resist profile 66 has openings 68 to expose surface areas 70.

Figure 13:
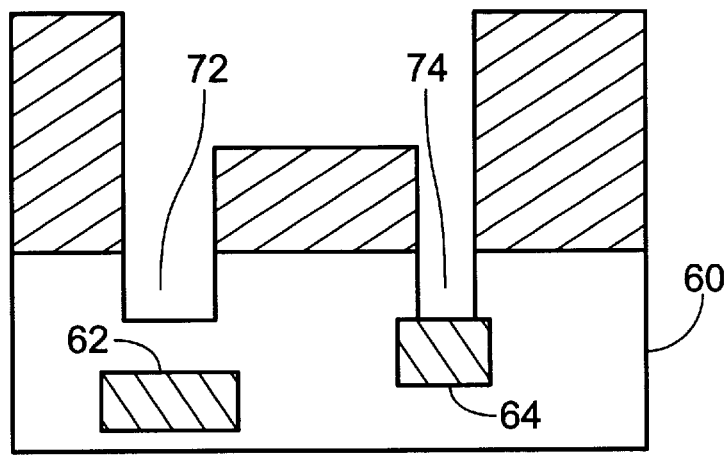
FIG. 13 is a partial cross-sectional view of the IC dielectric of FIG. 12 with vias formed in the IC dielectric.

FIG. 13 is a partial cross-sectional view of IC dielectric 60 of FIG. 12 with vias 72 and 74 formed in IC dielectric 60. Via 72 is formed between surface area 70 and a predetermined interlevel. Via 74 is formed between surface area 70 and second connection area 64 at a second interlevel. Alternately, vias 72 and 74 are both formed to a predetermined interlevel between surface 70 and second connection area 64.

Figure 14:
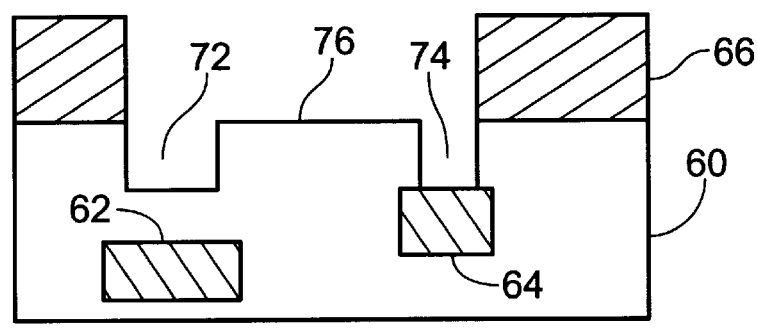
FIG. 14 is a partial cross-sectional view of the IC dielectric of FIG. 13 with a layer of photoresist removed to expose a surfaced area.

FIG. 14 is a partial cross-sectional view of IC dielectric 60 of FIG. 13 with a layer of photoresist 66 removed to expose a surface area 76. Part of resist 66 is left overlying dielectric 60 to protect it from the subsequent etch process.

Figure 15:
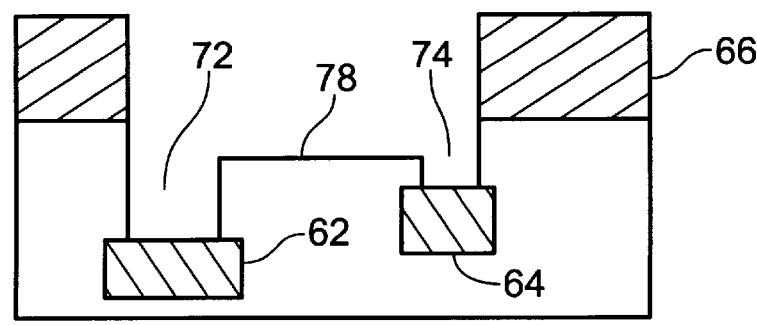
FIG. 15 is a partial cross-sectional view of the IC dielectric of FIG. 14 with a trench formed from the exposed surface to a third interlevel, and the via completed to the first connection area at the first interlevel.
Figure 16:
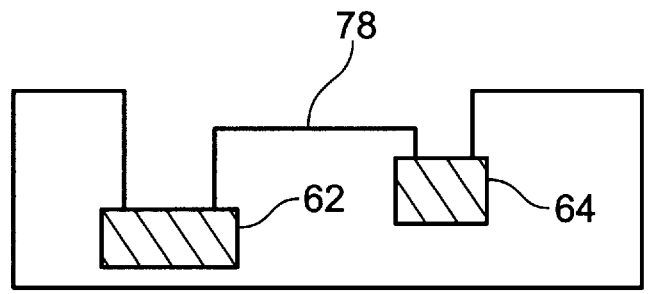
FIG. 16 is a partial cross-sectional view of the IC dielectric of FIG. 15 with the photoresist profile stripped away.

FIG. 15 is a partial cross-sectional view of IC dielectric 60 of FIG. 14 with a trench formed from exposed surface 76 to a third interlevel 78, and via 72 completed to first connection area 62 at the first interlevel. FIG. 16 is a partial cross-sectional view of IC dielectric 60 of FIG. 15 with the photoresist profile 66 stripped away.

Figure 17:
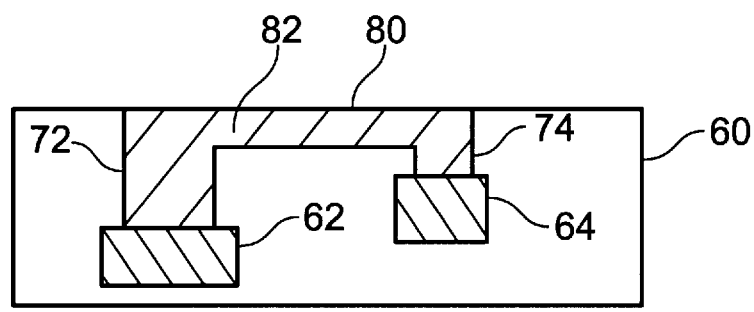
FIG. 17 is a partial cross-sectional view of the IC dielectric of FIG. 16 with a deposition of conductive material in the areas of the dielectric where dielectric material was removed to form electrical interconnects to the first, second, and third interlevels from the surface.

FIG. 17 is a partial cross-sectional view of IC dielectric 60 of FIG. 16 with a deposition of conductive material 80 in the areas of dielectric 60 where dielectric material was removed to form electrical interconnects to the first, second, and third interlevels from the surface. FIG. 17 shows first connection area 62 electrically connecting to via 72, with via 72 making an electrical connection to a trench, or a line 82. Trench 82 makes an electrical connection to via 74, which in turn makes an electrical connection to second connection area 64. Alternately, line 82 connects one or both vias 72 and 74, or line 82 connects to other lines and vias not shown.

FIGS. 18 through 23 illustrate the method of the present invention in performing a dual damascene process with the use of a buffer layer situated between the dielectric surface and the photoresist profile.

Figure 18:
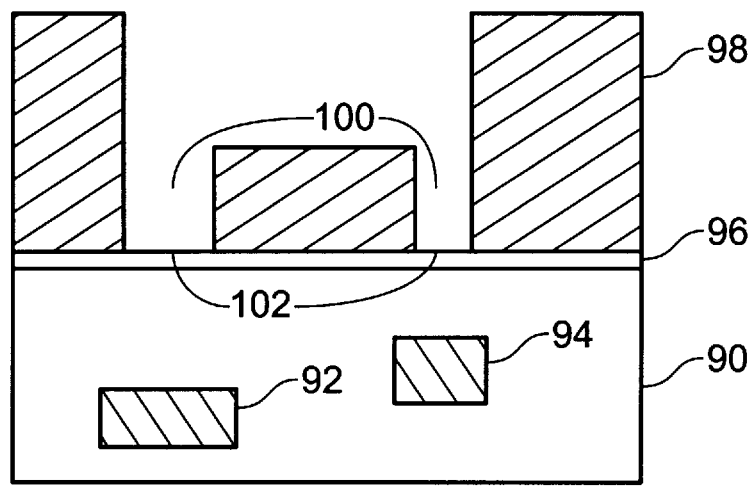
FIG. 18 is a partial cross-sectional view of an IC interlevel dielectric having two connecting areas at two different interlevels in the dielectric with an overlying buffer layer, and an overlying photoresist profile.

FIG. 18 is a partial cross-sectional view of an IC dielectric 90 having two connecting areas 92 and 94 at two different interlevels in dielectric 90 with an overlying buffer layer 96, and an overlying photoresist profile 98. Resist profile 98 has openings 100 to expose buffer layer areas 102.

Figure 19:
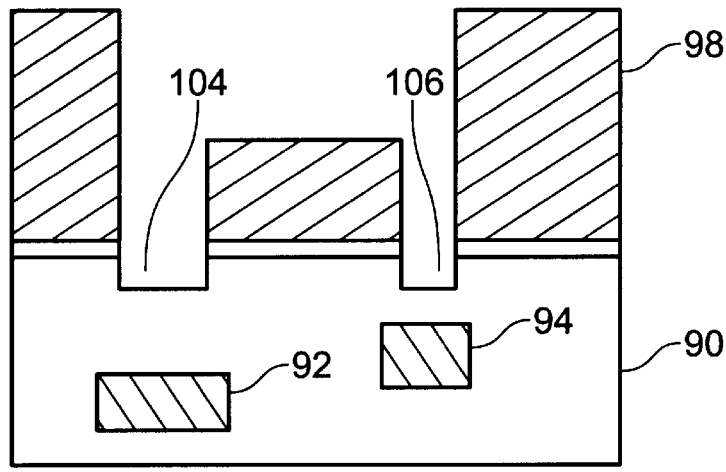
FIG. 19 is a partial cross-sectional view of the IC dielectric of FIG. 18 with vias formed to a predetermined interlevel in the dielectric.
Figure 20:
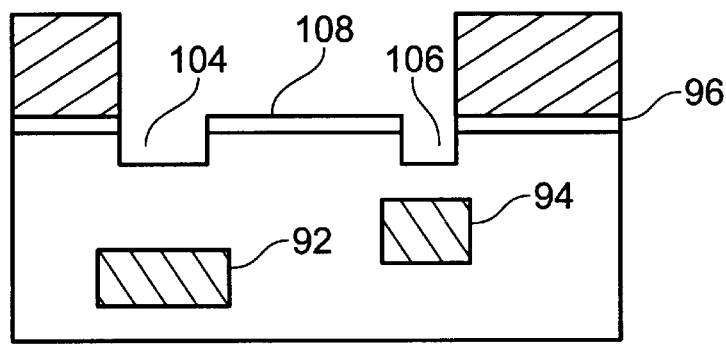
FIG. 20 is a partial cross-sectional view of the IC dielectric of FIG. 19 with a layer of photoresist removed to expose a buffer layer surface area.

FIG. 19 is a partial cross-sectional view of IC dielectric 90 of FIG. 18 with vias 104 and 106 formed to a predetermined interlevel in dielectric 90. Alternately, this first dielectric etch step completes one or more vias 104 and 106 to underlying connection areas 92 and 94. FIG. 20 is a partial cross-sectional view of IC dielectric 90 of FIG. 19 with a layer of photoresist 98 removed to expose a buffer layer surface area 108.

Figure 21:
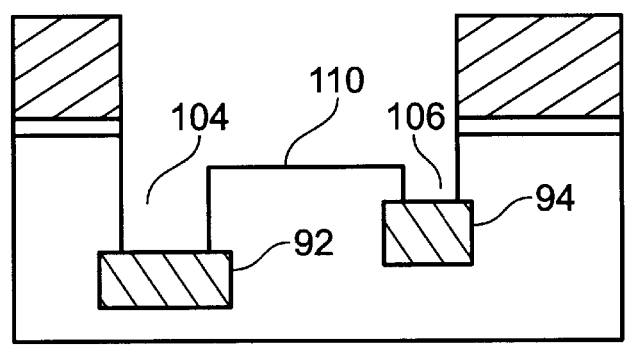
FIG. 21 is a partial cross-sectional view of the IC dielectric of FIG. 20 with the exposed buffer area removed and a trench formed to a predetermined interlevel, and vias formed to the two connection areas.
Figure 22:
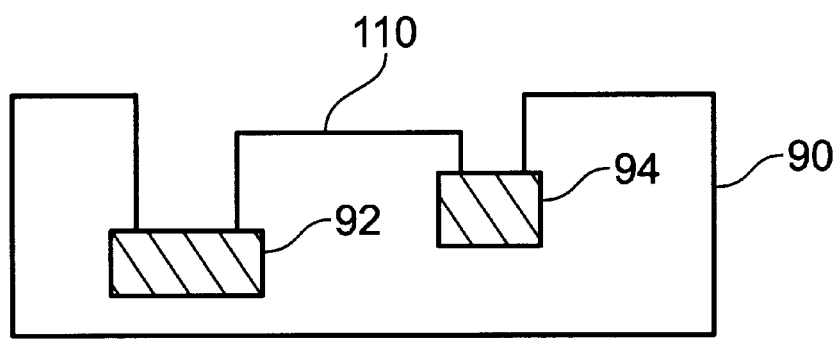
FIG. 22 is a partial cross-sectional view of the IC dielectric of FIG. 21 with the remaining photoresist and buffer stripped away.

FIG. 21 is a partial cross-sectional view of IC dielectric 90 of FIG. 20 with the exposed buffer area 108 removed and a trench formed to a third interlevel 110, and vias 104 and 106 formed to connection areas 92 and 94, respectively. FIG. 22 is a partial cross-sectional view of IC dielectric 90 of FIG. 21 with the remaining photoresist 98 and buffer 96 stripped away.

Figure 23:
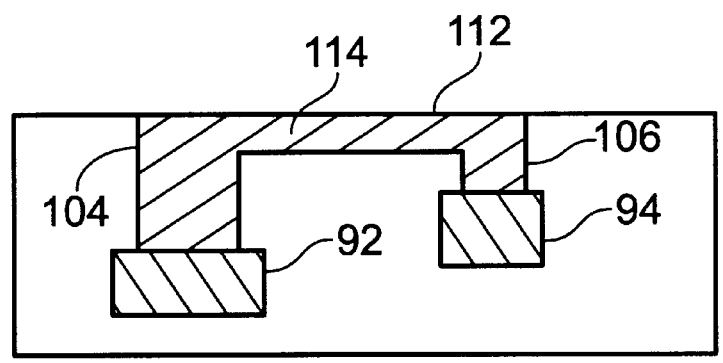
FIG. 23 is a partial cross-sectional view of the IC dielectric of FIG. 22 with a deposition of conductive matter in the areas of the dielectric where dielectric material was removed to form electrical vias to the first and second connection areas, and a line connecting the two vias.

FIG. 23 is a partial cross-sectional view of IC dielectric 90 of FIG. 22 with a deposition of conductive matter 112 in the areas of dielectric 90 where dielectric material was removed to form electrical vias 104 and 106, respectively, to the first and second connection areas 92 and 94, and a line 114 connecting vias 104 and 106. In this manner, first connection area 92 and second connection area 94 are electrically interfaced alternately, line 114 connects to one or both vias 104 and 106, or line 114 connects to other lines and vias not shown.

Figure 24:
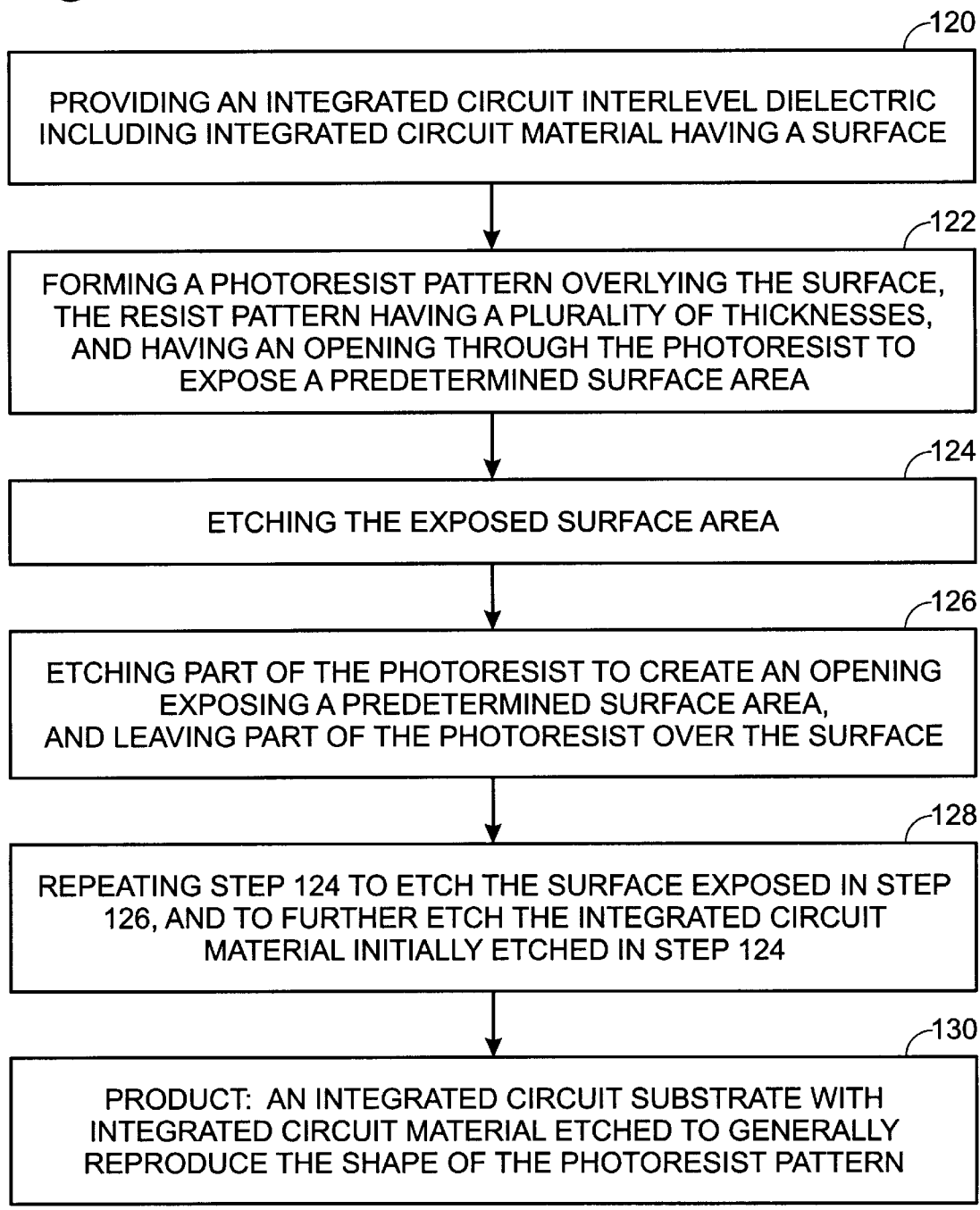
FIG. 24 is a flow diagram illustrating the steps of the method of the present invention.

FIG. 24 is a flow diagram illustrating the steps of the method of the present invention. Step 120 is providing an integrated circuit interlevel dielectric including integrated circuit material having a surface. Step 122 forms a photoresist pattern overlying the surface, the resist pattern having a plurality of predetermined thicknesses, and having an opening through the photoresist to expose a predetermined surface area. Step 124 is etching the exposed surface area. Step 126 is etching part of the photoresist to create an opening exposing a predetermined surface area, and leaving part of the photoresist over the surface. Step 128 is repeating step 124 to etch the surface exposed in step 126, and to further etch the integrated circuit material initially etched in step 124. Step 130 yields a product, an integrated circuit dielectric with integrated circuit material etched to generally reproduce the shape of the photoresist pattern.

It is a feature of the present invention that steps 126 and 128 are repeat of a plurality of times, whereby the integrated circuit material is etched to a plurality of levels from the surface. In the preferred embodiment of the present invention the photoresist pattern has two thicknesses with the second thickness greater than the first thickness, and step 126 includes etching a layer having a predetermined thickness greater than the first photoresist pattern thickness to expose a predetermined surface area.

It is another feature of the invention that the etching of step 124 is performed using an etchant chosen to minimize the production of polymer by-products. The use of $C_2F_6$ as such an etchant is appropriate. $C_2F_6$ inhibits the formations of polymers over the remaining photoresist profile as the underlying dielectric material is etched. Thick deposits of polymer on the photoresist profile impede the etching of photoresist in step 126. Any unintended photoresist left after performing step 126 will lead to inaccuracies in the etching of integrated circuit material in step 128, as the effective shape and thickness of the resist are changed by the polymer. In the preferred form of the invention the photoresist is etched in step 126 at a temperature of less than 15° C. In most applications the photoresist is etched in step 126 at a temperature of between 10° C. and −10° C., typically a temperature of −5° C. is used. It is a novel feature of the invention that the photoresist is only partly removed in step 126. Part of the photoresist is removed to expose a surface area for etching in step 128, and part of the resist is kept on the surface to protect the surface from etching in step 128. In conventional processes the photoresist is typically stripped or ashed to completely remove it from the surface. The photoresist ashing process is typically performed at a high temperatures. In the controlled photoresist etching of the present invention the temperature is kept low to increase etch control. It is also a feature of the present invention that the etching in step 126 is performed with an anisotropic plasma etch, typically the anisotropic plasma etch consists of oxygen. Although resist is conventionally stripped with an oxygen plasma, the use of a low temperature and timed exposure, disclosed herein, allows an oxygen plasma to be used to remove the resist in a controlled fashion.

In the preferred form of the invention the etching in step 128 is performed using a gas selective with regards to the dielectric, as opposed to the underlying wafer material. $C_3F_8$ is an etchant that is used to perform this step. $C_3F_8$ creates more polymers on the photoresist profile, than a gas such as $C_2F_6$, but since the photoresist is completely ashed in later steps, the polymer build up is not a major concern. $C_3F_8$ does have the advantage of having an etch selectivity of 20:1 with regard to oxide, as opposed to silicon. $C_2F_6$ has a selectivity of only 4:1 with regard to oxide and silicon. When the dielectric is comprised an oxide integrated circuit material overlying a layer of silicon, then a via formed in step 128 with the use of $C_3F_8$, will stop at the underlying silicon layer. The use of $C_3F_8$ to etch through oxide to a silicon underlying layer reduces the concern for etch exposure times and protects the substrate underlying the dielectric.

In a preferred embodiment of the invention, wherein electrical interconnects are formed from the surface to areas in the integrated circuit material, the method includes the further steps, following step 128 of stripping, to completely remove from the surface, any photoresist remaining after step 128, and depositing a conductive material where integrated circuit material is removed in steps 124 and 128. The remaining photoresist is ashed using conventional stripping processes, and CVD copper is typically deposited in the dielectric as the conductive material.

Figure 25:
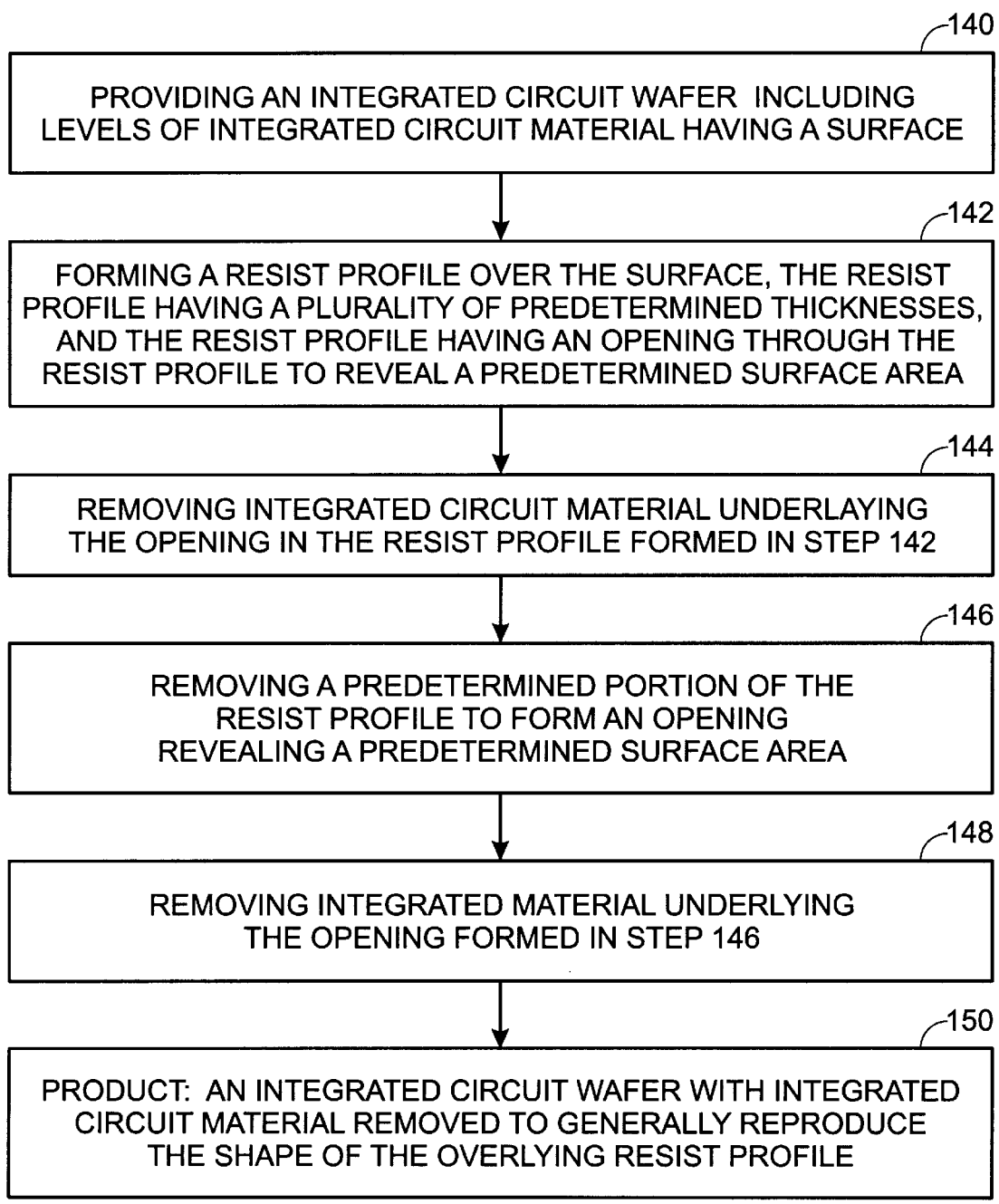
FIG. 25 is a flow diagram illustrating the steps of another feature of the present invention.

FIG. 25 is a flow diagram illustrating the steps of another feature of the present invention. Step 140 is providing an integrated circuit wafer including levels of integrated circuit material having a surface. Step 142 is forming a resist profile over the surface, the resist profile having a plurality of predetermined thicknesses, and the resist profile having an opening through the resist profile to reveal a predetermined surface area. Step 144 is removing integrated circuit material underlying the opening in the resist profile formed in step 142. Step 146 is removing a predetermined portion of the resist profile to form an opening revealing a predetermined surface area. Step 148 is removing integrated circuit material underlying the opening formed in step 146. Step 150 is a product, an integrated circuit wafer with integrated circuit material removed to generally reproduce the shape of the overlying resist profile.

In the preferred embodiment of the present invention the resist profile formed in step 142 has a first and second thickness with the second thickness greater than the first thickness. Steps 144 and 148 include the removal of integrated circuit material to two interlevels with a first interlevel underlying the opening formed in step 142, and a second interlevel underlying the opening formed in step 146, so that the second interlevel is closer to the surface then the first interlevel.

In the preferred embodiment of the present invention step 144 includes the removal of integrated circuit material, underlying the opening formed in step 142, to a predetermined interlevel. Also, step 148 includes the removal of integrated circuit material underlying the opening formed in step 146 to the second interlevel, and the further removal of integrated circuit material underlying the opening formed in step 142, from the predetermined interlevel of step 144 to the first interlevel.

It is a feature of the present invention that the wafer has connection areas in the integrated circuit material at two interlevels and that steps 144 and 148 include the removal of integrated circuit material to three interlevels. Step 144 includes the removal of integrated circuit material to form a via to a second connection area at a second interlevel and step 148 includes the further removal of integrated circuit material, from integrated circuit material removed in step 144, to form a via to a first connection area at a first interlevel, and step 148 further includes the removal of integrated circuit material to form a trench underlying the opening formed in step 146.

It is a feature of the invention that the same method is used, in a wafer having connection areas in the integrated circuit at three or more interlevels, in steps 144 and 148 to remove integrated circuit material to four or more interlevels. In a method similar to that explained in FIGS. 12–17, a resist pattern is formed over the dielectric surface, and a first dielectric etch is performed. Three or more vias are formed through openings in the resist. Some of the vias may reach connection areas in the dielectric. Alternately, all the vias are only begun in this step, and are completed during the next dielectric etch step. Next, a resist etch is performed to form an opening in the resist to the dielectric surface. In the next step, the second dielectric etch, the newly exposed surface area is etched to form a trench, often the trench overlies some or all of the vias holes started in the first etch step. In the second etch step the vias are completed. Connection areas closer to the dielectric surface stop overlying vias from continuing any further, since the etchant used is selective with regard to the dielectric material, as opposed to the material used in the connection areas. The etch continues until all the vias access connection areas.

The preferred embodiment of the present invention includes the further steps, following step 148 of removing the remaining resist profile, left overlying the surface and depositing a conductive material in the areas of the wafer where integrated circuit material is removed in steps 144 and 148 to form electrical interconnect vias to the first and second connection areas from the surface, and depositing a conductive material in the trench formed in step 148 to form a line between the third interlevel and the surface. The method further includes the step of polishing the surface, including the filled conductive interconnects to form a planar surface having a predetermined flatness, whereby electrical interconnects are made to the surface from multiple levels in the wafer. The surface is then typically finished with a CMP process, as is well known in the art.

In the preferred embodiment of the present invention the conductive material used in the interconnects is selected from the group consisting of CVD copper, and tungsten, and the integrated circuit material is selected from the group consisting of silicon dioxide, tetraethyl orthosilicate (TEOS) oxide, silane oxide, boron nitride (BN), and nitride. Further, it is a feature of the invention that the width of the opening formed in the resist profile in step 142 is less than 5 $\mu$m and that steps 144 and 148 include forming a via having a width less than 5 $\mu$m. Features of approximately 0.25 $\mu$m are currently the state of the art in conventional processing using phase shifting reticles to improve the resolution of features in a photoresist pattern. These same phase shifting resolution enhancements are incorporated into the design of multi-level reticles and photoresist patterns that are the subject of pending applications, Ser. No. 08/660,870, Docket No. SMT 166 and Ser. No. 08/665,013, Docket No. SMT 234, mentioned earlier. The resolution of vias with the method of the present inventions is limited only by the resolution inherent in the resist pattern, and so will keep pace will conventional processes as photoresist mask resolution is improved.

In a variation of the present invention a new step is included, before step 142, of forming a sacrificial buffer layer, having a predetermined thickness, over the surface, with the buffer layer having a removal selectivity different from the resist profile and integrated circuit material, whereby the resist profile and buffer layer control the removal of integrated circuit material. It is a feature of this version of the invention that the wafer has connection areas at two interlevels and that the integrated circuit material is removed to three interlevels.

In a preferred embodiment, the wafer has two connection areas at two interlevels, and integrated circuit material is removed to three interlevels in step 144. Step 144 includes the removal of the buffer layer underlying the opening in the resist profile formed in step 142 to reveal a predetermined surface area, and removing the surface area to form a via to a predetermined interlevel. Further, step 146 includes revealing a predetermined area of buffer layer, and step 148 includes the removal of the predetermined buffer layer area underlying the opening in the resist profile formed in step 146. Also, step 148 includes the further removal of integrated circuit material from the area underlying the opening formed in step 142 to form vias to a first connection area on a first interlevel and a second connection area on a second interlevel, and step 148 further includes the removal of integrated circuit material underlying the opening formed in step 146 to form a trench from the surface to the third interlevel.

It is a feature of the present invention that the sacrificial buffer layer is selected from the group consisting of silicon, metal, semiconductor, and dielectrics having a different removal selectivity from adjacent integrated circuit material. The buffer layer is used when the underlying dielectric must be protected of processing steps occurring either before the photoresist is formed, or after photoresist is removed. The buffer layer is also used in some process to enhance the control of etching into the IC material of the dielectric.

FIG. 26 is a more detailed flow diagram illustrating the steps of the method of the present invention. Step 160 provides an integrated circuit interlevel dielectric including an oxide layer having interlevels and a surface, the oxide layer overlying a silicon layer. Step 162 forms a photoresist pattern overlying the surface, the photoresist pattern having two thicknesses with the second thickness greater than the first thickness, the photoresist having an opening through the photoresist to expose a predetermined surface area, and the photoresist having an etch selectivity different then the oxide. Step 164 is etching the surface area exposed in step 162 with $C_2F_6$ to begin a via hole in the oxide. Step 166 is etching the photoresist at a temperature between 10° C. and −10° C. to remove a layer across the photoresist greater than the first thicknesses, with less than the second thickness, the photoresist being etched to expose a predetermined surface area. Step 168 is etching, with $C_3F_8$, the surface area exposed in step 166 to form a trench in the oxide from the surface to a predetermined interlevel in the oxide, and further etching the via hole begun in step 164 to form a hole through the oxide to the silicon layer. Step 170 is a product, an integrated circuit interlevel dielectric with oxide removed to transfer a multi-level pattern into the oxide.

A detailed description of a bi-level damascene etching process using a Centura 5300 High Density Plasma (HDP) etching chamber is given below. Table 1 provides of summary of the chamber conditions for each step of the process.

The chamber has some conditions common to all 6 steps. The helium backside cooling, to regulate the wafer temperature, is set to a pressure of 16 Torr. The chamber roof temperature is maintained at 260° C., and the wall temperature at 200° C. The chuck, in which the substrate is held, is maintained at a temperature of −5° C.

TABLE 1

| Step | Etch Gas | Source Power | Bias Power | Throttle Valve | Pressure | Time |
| --- | --- | --- | --- | --- | --- | --- |
| 1 Via Etch | 20 sccm $C_2F_6$ | 2800 W | 800 W | fixed at 30% | ~3.5 mT | 65 sec |
| 2 Bias_Delay | 90 sccm $O_2$ | 2800 W | 800 W | fixed at 100% | ~2 mT | 3 sec |
| 3 1st Resist Etch | 100 sccm $O_2$ | 2500 W | 130 W | fixed at 20% | ~12 mT | 15 sec |
| 4 Line Etch | 20 sccm $C_3F_8$ | 2800 W | 800 W | fixed at 30% | ~4.5 mT | 40 sec |
| 5 Bias_Delay | 90 sccm $O_2$ | 2800 W | 800 W | fixed at 100% | ~2 mT | 3 sec |
| 6 Resist Strip | 100 sccm $O_2$ | 2500 W | 130 W | fixed at 20% | ~12 mT | 30 sec |

In step 1 a via etch is performed using $C_2F_6$ at a flow rate of 20 standard cubic centimeters per minute (sccm). The plasma is generated by approximately 2800 watts (W) of radio frequency (RF) power at 13.56 megahertz (MHz), with the bias on the chuck at 800 W. The throttle valve is fixed at 30%, to set the pressure to approximately 3.5 milliTorr (mT). The process lasts approximately 65 seconds. During step 1 the dielectric surface is etched through an opening in the photoresist as explained in FIG. 8.

Step 2 is a bias delay to transition between the via etch of step 1 and the first resist etch of step 3. Oxygen is the etch gas used at a rate of 90 sccm. The RF power level is approximately 2800 W and the bias 800 W. The throttle valve is set at 100% to establish a pressure of approximately 2 mT for three seconds.

In step 3, the first resist etch, oxygen is used at a flow rate of 100 sccm. The RF power level is approximately 2500 W and the bias is 130 W. The throttle valve is set at 20% to establish a pressure of 12 mT for 15 seconds. During step 3 the resist covering the dielectric is partially removed to expose a dielectric surface as shown in FIG. 9.

Step 4, the line etch, uses $C_3F_8$ at a rate of 20 sccm. The RF power level is approximately 2800 W and the bias power 800 W. The throttle valve is fixed at 30% to establish a pressure of approximately 4.5 mT for 40 seconds. During step 4 the dielectric surface exposed in step 3 is etched to a second interlevel in the dielectric as shown in FIG. 10.

Step 5 is a bias delay to transition between the line etch of step 4 and the resist strip of step 6. Oxygen is the etch gas used at a rate of 90 sccm. The RF power level is approximately 2800 W and the bias 800 W. The throttle valve is set at 100% to establish a pressure of approximately 2 mT for three seconds.

In step 6, the resist strip, oxygen is used at a flow rate of 100 sccm. The RF power level is approximately 2500 W and the bias is 130 W. The throttle valve is set at 20% to establish a pressure of 12 mT for 30 seconds. During step 6 the resist covering the dielectric is completely removed in preparation of fillings the via and line with CVD copper as shown in FIG. 11.

The method of the present invention is useful for constructing via and trench interconnects of copper, or other metals or metal compounds, to multiple layers in a dielectric using a damascene process. Although the method of the present invention has been specifically described with a two level photoresist pattern, the method is also applicable to the use of photoresist having three or more thickness to form interconnects to three or more interlevels in a dielectric. As in the two level resist profile method, multiple levels in the integrated circuit material are accessed with the use of a single resist profile. The surface undergoes a first etch process using through an opening in the photoresist. The photoresist is then partially removed to reveal another integrated circuit material surface area. A newly exposed surface area is etched, perhaps with $C_2F_6$, to inhibit the production of polymers. In addition, the first via is further etched in the second IC material etch. Following the second IC material etch, the photoresist profile is etched to reveal a surface area, leaving at least some photoresist protecting other areas of the surface. Then the newly exposed surface area is etched. Any vias formed during the first etch, not already accessing underlying connection areas are etched to completion during this step. Other modifications and variations within the scope of the present invention will occur to those skilled in the art.

What is claimed is:

1. In an integrated circuit wafer including levels of integrated circuit material having a surface, a method of forming electrical interconnects from the surface to a plurality of interlevels in the integrated circuit material, comprising the steps of:

a) forming a single bi-level resist profile over the surface, the resist profile having a plurality of thicknesses and openings, with one thickness an opening to form an interconnect line, and a second thickness an opening through the resist profile to reveal an integrated circuit material surface area to form a via, the opening for the interconnect line intersecting the opening for the via;

b) removing integrated circuit material underlying the opening in the resist profile formed in step a);

c) after Step b), removing a portion of the resist profile to form an opening revealing a second integrated circuit surface area; and d) removing integrated circuit material underlying the opening formed in step c), whereby integrated circuit material is removed to generally reproduce the shape of the overlying resist profile.

2. The method as in claim 1 in which the resist profile formed in step a) has a first and second thickness, with the second thickness greater than the first thickness, and in which steps b) and d) include the removal of integrated circuit material to two interlevels with a first interlevel underlying the opening formed in step a), and a second interlevel underlying the opening formed in step c), so that the second interlevel is closer to the surface than the first interlevel.

3. The method as in claim 2 in which step b) includes the removal of integrated circuit material, underlying the opening formed in step a), to an interlevel, and in which step d) includes the removal of integrated circuit material underlying the opening formed in step c) to the second interlevel, and the further removal of integrated circuit material underlying the opening formed in step a), from the interlevel of step b), to the first interlevel.

4. The method as in claim 3 in which the wafer has connection areas in the integrated circuit material at two interlevels, and in which steps b) and d) include the removal of integrated circuit material to three interlevels.

5. The method as in claim 4 in which step b) includes the removal of integrated circuit material to form a via to a second connection area at a second interlevel, and in which step d) includes the further removal of integrated circuit material, from integrated circuit material removed in step b), to form a via to a first connection area at a first interlevel, and in which step d) further includes the removal of integrated circuit material to form a trench underlying the opening formed in step c).

6. The method as in claim 5 including the further steps, following step d), of:

e) removing the remaining resist profile, left overlying the surface;

f) depositing a conductive material in the areas of the wafer where integrated circuit material is removed in steps b) and d) to form electrical interconnect vias to the first and second connection areas from the surface, and depositing a conductive material in the trench formed in step d) to form a line between the third interlevel and the surface; and g) polishing the surface, including the filled conductive interconnects to form a planar surface having a flatness, whereby electrical connections are made to the surface from multiple levels in the wafer.

7. The method as in claim 1 in which the etching of step b) is performed using an etchant chosen to minimize the production of polymer by-products.

8. The method as in claim 1 in which the conductive material used in the interconnects is selected from the group consisting of CVD copper and tungsten, and the integrated circuit material is selected from the group consisting of silicon dioxide, TEOS oxide, silane oxide, BN, and nitride.

9. The method as in claim 1 in which the width of the opening formed through the resist profile in step a) is less than 5 $\mu$m, and in which steps b) and d) include forming a via having a width less than 5 $\mu$m.

10. The method as in claim 1 in which the etching in step c) is performed with an anisotropic plasma etch.

11. The method as in claim 10 in which the anisotropic plasma etch consisting of oxygen.

12. The method as in claim 1 in which step b) is performed by etching using a gas selective with regards to a dielectric as opposed to the underlying wafer material.

13. The method as in claim 2 including the further step, before step a), of forming a sacrificial buffer layer, having a thickness, over the integrated circuit material surface, the buffer layer having a removal selectivity different from the resist profile and integrated circuit material, whereby the resist profile and buffer layer control the removal of integrated circuit material.

14. The method as in claim 13 in which the wafer has connection areas at two interlevels, and in which the integrated circuit material is removed to three interlevels in step b).

15. The method as in claim 14 in which step b) includes the removal of the buffer layer underlying the opening in the resist profile formed in step a) to reveal the integrated circuit material surface area, and removing the integrated circuit material surface area to form a via to an interlevel, in which step c) includes revealing an area of buffer layer, in which step d) includes the removal of the buffer layer area underlying the opening in the resist profile formed in step c), in which step d) further includes the further removal of integrated circuit material from the area underlying the opening formed in step a) to form vias to a first connection area on a first interlevel and a second connection area on a second interlevel, and in which step d) further includes the removal of integrated circuit material underlying the opening formed in step c) to form a trench from the surface to a third interlevel.

16. The method as in claim 13 wherein the removed integrated circuit material is selected from the group consisting of silicon dioxide, TEOS oxide, silane oxide, BN, and nitride, and in which the sacrificial buffer layer is selected from the group consisting of silicon, metal, semiconductor, and dielectrics having a different removal selectivity from adjacent integrated circuit material.

17. The method as in claim 3 wherein the wafer has connection areas in the integrated circuit at three or more interlevels, and in which steps b) and d) include the removal of integrated circuit material to four or more interlevels.

18. In an integrated circuit interlevel dielectric including integrated circuit material having a surface, a method of etching the integrated circuit material comprising the steps of:

a) forming a single bi-level photoresist pattern overlying the integrated circuit surface, the resist pattern having a plurality of thicknesses and openings, with a first thickness an opening to form an interconnect line, and a second thickness an opening through the photoresist to expose an integrated circuit material surface area to form a via intersecting the interconnect line;

b) etching the exposed integrated circuit material surface area;

c) after Step b), etching part of the photoresist to create an opening, exposing a second integrated circuit material surface area, and leaving part of the photoresist over the integrated circuit material surface; and d) repeating step b) to etch the integrated circuit material surface exposed in step c), and to further etch the integrated circuit material initially etched in step b), whereby the integrated circuit material is etched to generally reproduce the shape of the photoresist pattern.

19. The method as in claim 18 in which steps c) and d) are repeated a plurality of times, whereby the integrated circuit material is etched to a plurality of levels from the surface.

20. The method as in claim 18 in which the photoresist pattern has two thicknesses with the second thickness greater than the first thickness, and in which step c) includes etching a layer having a thickness greater than the photoresist pattern first thickness to expose the second integrated circuit material surface area.

21. The method as in claim 18 in which the etching of step b) is performed using an etchant chosen to minimize the production of polymer by-products.

22. The method as in claim 18 in which the photoresist is etched in step c) with an anisotropic plasma etch.

23. The method as in claim 18 in which the anisotropic plasma etch consists of oxygen.

24. The method as in claim 18 in which the width of the opening formed through the resist profile in step a) is less than 5 μm, and in which steps b) and d) include forming a via having a width less than 5 μm.

25. The method as in claim 18 in which the etching of step b) is performed using a gas selective with regards to the dielectric as opposed to the underlying wafer material.

26. The method as in claim 18 wherein electrical interconnects are formed from the surface to areas in the integrated circuit material, and including the further steps, following step d), of:

e) stripping, to completely remove from the surface, any photoresist remaining after step d);

f) depositing a conductive material where integrated circuit material is removed in steps b) and d).

27. A method for transferring a photoresist pattern onto an integrated circuit interlevel dielectric including an oxide layer having interlevels and a surface, the oxide layer overlying a silicon layer, the method comprising the steps of:

a) forming a single photoresist pattern overlying the surface, the photoresist pattern having two thicknesses with the second thickness greater than the first thickness, the photoresist having an opening through the photoresist second thickness to expose an integrated circuit material surface area to form a via and an intersecting opening through the photoresist first thickness to form a trench, the photoresist having an etch selectivity different than the oxide;

b) etching the integrated circuit surface area exposed in step a) with $C_2F_6$ to begin a via hole in the oxide;

c) after Step b), etching the photoresist at a temperature between 10° C. and −10° C. to remove a layer across the photoresist greater than the first thickness, but less than the second thickness, the photoresist being etched to expose a second integrated circuit material surface area; and d) etching, with $C_3F_8$, the second integrated circuit material surface area exposed in step c) to form a trench in the oxide from the surface to a interlevel in the oxide, and further etching the via hole begun in step b) to form a hole through the oxide to the silicon layer, whereby the photoresist is selectively etched to from a multi-level damascene pattern in the oxide.

* * * * *